United States Patent
Dupuy et al.

(10) Patent No.: US 6,917,235 B2
(45) Date of Patent: Jul. 12, 2005

(54) LOW VOLTAGE CIRCUIT FOR INTERFACING WITH HIGH VOLTAGE ANALOG SIGNALS

(75) Inventors: Christian Dupuy, Peynier (FR); Hafid Amrani, Marseilles (FR); Hubert Cordonnier, Marseilles (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/671,200

(22) Filed: Sep. 25, 2003

(65) Prior Publication Data

US 2004/0263233 A1 Dec. 30, 2004

(30) Foreign Application Priority Data

Jun. 24, 2003 (FR) .............................. 03 07629

(51) Int. Cl.⁷ ............................... H03L 5/00
(52) U.S. Cl. .................... 327/333; 327/103; 327/319
(58) Field of Search ............................. 327/50–54, 62, 327/63, 65–67, 103, 318, 319, 333; 326/62, 63, 80, 81

(56) References Cited

U.S. PATENT DOCUMENTS

| | | | |
|---|---|---|---|
| 3,946,303 A | 3/1976 | Streit et al. ................ | 323/22 T |
| 5,198,700 A | 3/1993 | Whiteside .................... | 307/273 |
| 5,227,714 A | 7/1993 | Lou ............................ | 323/282 |
| 5,276,358 A | * | 1/1994 Carvajal ....................... | 327/31 |
| 5,287,071 A | 2/1994 | Olmstead et al. ........... | 330/258 |

(Continued)

FOREIGN PATENT DOCUMENTS

| EP | 0 565 806 | 10/1993 |
|---|---|---|
| EP | 0 998 022 | 5/2000 |

OTHER PUBLICATIONS

Data sheet: Intersil, "Buck and Synchronous–Rectifier (PWM) Controller and Output Voltage Monitor", HIP6004E, Oct. 2001, File No. 4997.1, pp. 1–12.
Data sheet No. PD94251: International Rectifier, "Dual Synchronous PWM Controller with Current Sharing Circuitry and LDO Controller", IRU3046, Sep. 12, 2002, Rev. 1.8, pp. 1–20.
Data sheet: Linear Technology, 3–Phase, 5–Bit VID, 600kHz, Synchronous Buck Switching Regulator Controller, FES LTC3732, May 2002, pp. 1–28.
Data sheet: STMicroelectronics, "5–Bit Programmable Dual–Phase Controller", L6917B, Sep. 2002, pp. 1–33.
Data sheet: ON Semiconductor, "Two–Phase Buck Controller with Integrated Gate Drivers for VRM 9.0", PON CS5332, May 2001, Rev. 10, pp. 1–20.
Data sheet: Maxim Integrated Products, "VRM 9.0, Dual–Phase, Parallelable, Average Current–Mode Controller", MAX5037, Jul. 2002, Rev. 0, pp. 1–30.
Website printout: Maxim Integrated Products, "DC–DC Converter Tutorial", Oct. 19, 2000, pp. 1–9.

*Primary Examiner*—Tuan T. Lam
*Assistant Examiner*—Hai L. Nguyen
(74) *Attorney, Agent, or Firm*—Schneck & Schneck; Thomas Schneck; Mark Protsik

(57) ABSTRACT

An integrated circuit (IC) uses a current source coupled to means for current-to-voltage conversion to reject the unwanted high voltage signal and detects the wanted small voltage signal. In particular, the current source produces mirrored currents proportional to the high voltage signal, while the means for converting current-to-voltage rejects the common-mode current when there is no small signal voltage flowing through the sensing resistor. On the other hand, when the small signal voltage exists, a current flows across the sensing resistor and disturbs the balance of the current mirror. As a result, the common mode no longer exists and the means for converting current-to-voltage converts and amplifies this small signal current into a voltage proportional to the small voltage signal.

10 Claims, 3 Drawing Sheets

U.S. PATENT DOCUMENTS

| | | | |
|---|---|---|---|
| 5,402,064 A | 3/1995 | Eck et al. | 324/207.21 |
| 5,519,656 A | 5/1996 | Maccarrone et al. | 365/189.09 |
| 5,686,821 A | 11/1997 | Brokaw | 323/273 |
| 5,694,035 A | 12/1997 | Keeth | 323/349 |
| 5,698,972 A | 12/1997 | Keeth | 323/349 |
| 5,801,556 A | 9/1998 | LeFevre | 327/103 |
| 5,889,393 A | 3/1999 | Wrathall | 323/282 |
| 6,133,764 A * | 10/2000 | Griffith et al. | 327/65 |
| 6,184,724 B1 * | 2/2001 | Lin | 327/80 |
| 6,188,211 B1 | 2/2001 | Rincon-Mora et al. | 323/280 |
| 6,304,131 B1 | 10/2001 | Huggins et al. | 327/538 |
| 6,448,750 B1 | 9/2002 | Shor et al. | 323/282 |
| 6,483,345 B1 * | 11/2002 | Whittaker et al. | 326/62 |
| 6,771,117 B2 * | 8/2004 | Nakai | 327/541 |
| 2002/0070762 A1 | 6/2002 | You et al. | 327/55 |

* cited by examiner

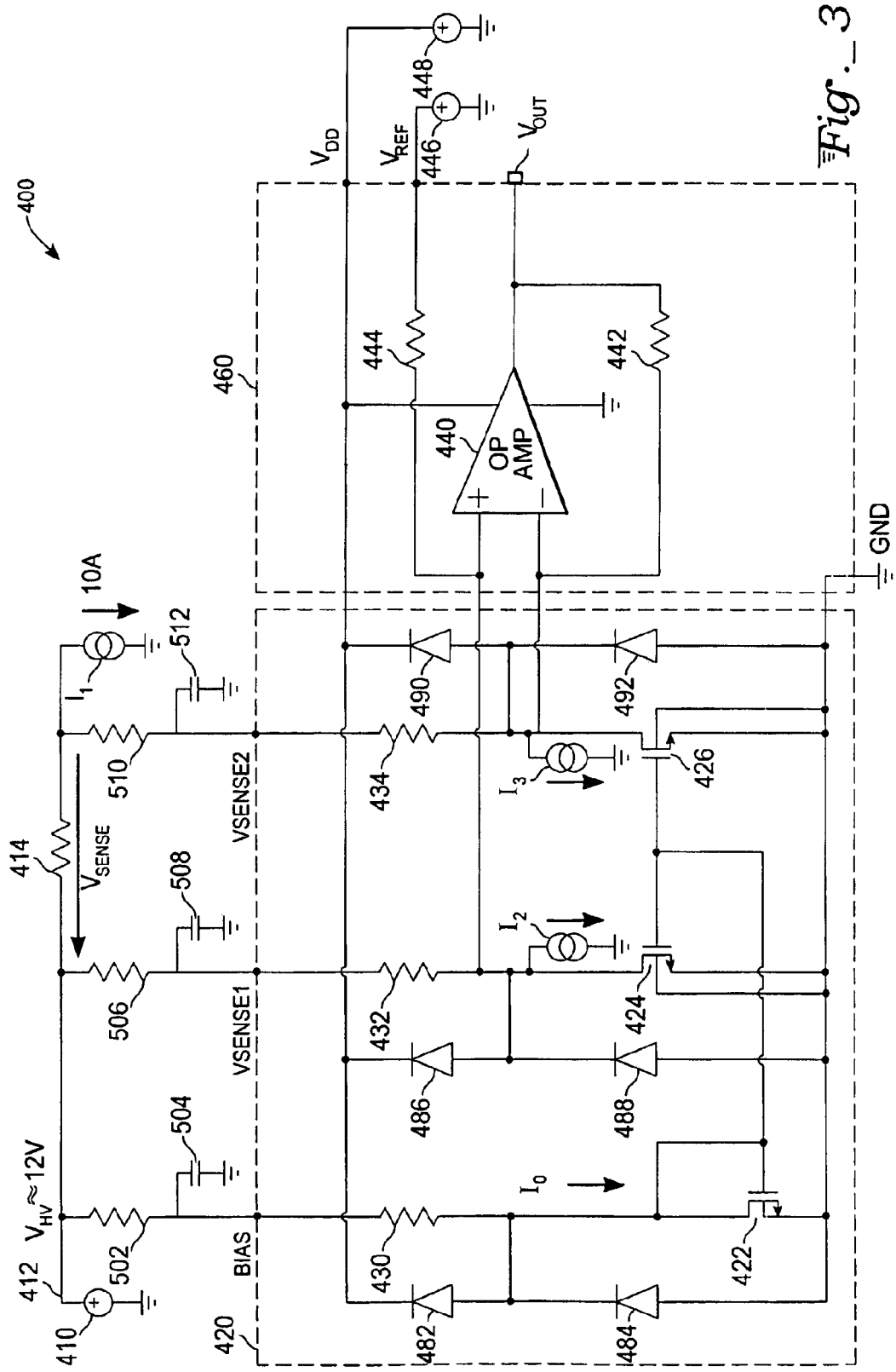
Fig._3

LOW VOLTAGE CIRCUIT FOR INTERFACING WITH HIGH VOLTAGE ANALOG SIGNALS

TECHNICAL FIELD

The invention relates to integrated circuits fabricated using a "low voltage" (power supply ≦5 v) technology for interfacing with high voltage analog signals, and in particular to circuits for accurately sensing and amplifying a low voltage differential signal that has been superimposed upon high DC voltage.

BACKGROUND ART

In low voltage integrated circuit (IC) design, information represented by a small differential signal is often superimposed upon a much larger voltage. It is often difficult to extract and amplify the differential signal and cancel the high voltage component. This is a typical situation in DC-to-DC (switching or linear) voltage regulators, or battery chargers. This function is also widely used in multiphase voltage regulation modules (VRM), integrated circuits (ICs) in which currents in different phases of the circuit must be matched. In such circuits, current on the high side of input power supply has to be measured accurately, while at the same time, the low voltage circuitry must be protected from over-voltages.

A classical approach to measure currents is to use a sensing resistor, often called a shunt resistor, typically on the order of milliohms, so that a millivolt signal can be detected by means of current flow on the order of an ampere.

One arrangement (FIG. 1) connects the sensing resistor $R_{sense}$, 104, in series with the high voltage source 102. But this method is not easily adapted to integrated circuits, since the integrated circuit must interface with $R_{sense}$ at a high voltage level.

Another less costly approach uses a π (pi) resistive network to measure the voltage drop across a shunt resistor. The π resistive network reduces the measured low voltage signal across the shunt resistor by a factor equal to the ratio of the resistors in the π network, thereby reducing the overall accuracy of the measurement. This reduction ratio can be significant because the low voltage signal is only on the order of millivolts.

Another sensing arrangement (FIG. 2) locates the sensing resistor $R_{sense}$ near the "ground" supply. The circuit 200 comprises a high ($V_{hv}$) line 204, a current source $I_1$, 206, a sensing resistor $R_{sense}$, 208, connected to an electrical ground and across which the current $I_1$, flows. $V_{sense}$ is measured across the sensing resistor 208. In this case, the sensing resistor 208 cannot match to the output impedance of a regulator under test (not shown).

An object of the invention is to provide a high voltage to low voltage interface circuit that can measure differential signals superimposed on this high voltage without reducing overall accuracy.

SUMMARY OF THE INVENTION

The objects of the invention have been achieved by an integrated circuit (IC) that rejects the unwanted high voltage signal and detects the wanted low voltage signal by means of a current mirror which is coupled to a means for current-to-voltage conversion. The current mirror circuitry uses the unwanted high voltage signal to produce a reference current from which mirrored currents are produced. When there is a small voltage signal superimposed upon the high voltage signal, while rejecting the high voltage signal via common mode rejection, the means for current to voltage conversion senses the small voltage signal through its differential mode. Consequently, the means for current-to-voltage conversion converts and amplifies the differential current into a voltage proportional therewith. (When there is no small voltage signal, means for current to voltage conversion rejects the mirrored currents via the common-mode-rejection. As a result, the means for current-to-voltage conversion produces zero voltage.)

BRIEF DESCRIPTION OF THE DRAWINGS

FIG. 3 illustrates a schematic diagram of an high voltage integrated circuit according to the present invention.

PREFERRED EMBODIMENT OF THE DESCRIPTION

Figure 1:
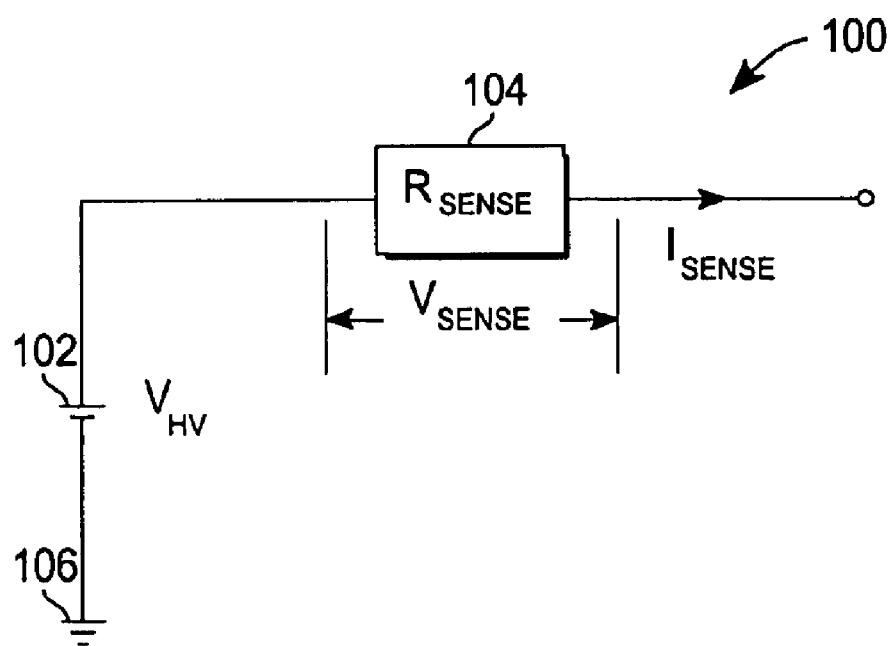
FIG. 1 illustrates a schematic diagram of a sensing resistor connected in series to a voltage source for measuring a low voltage signal.
Figure 2:
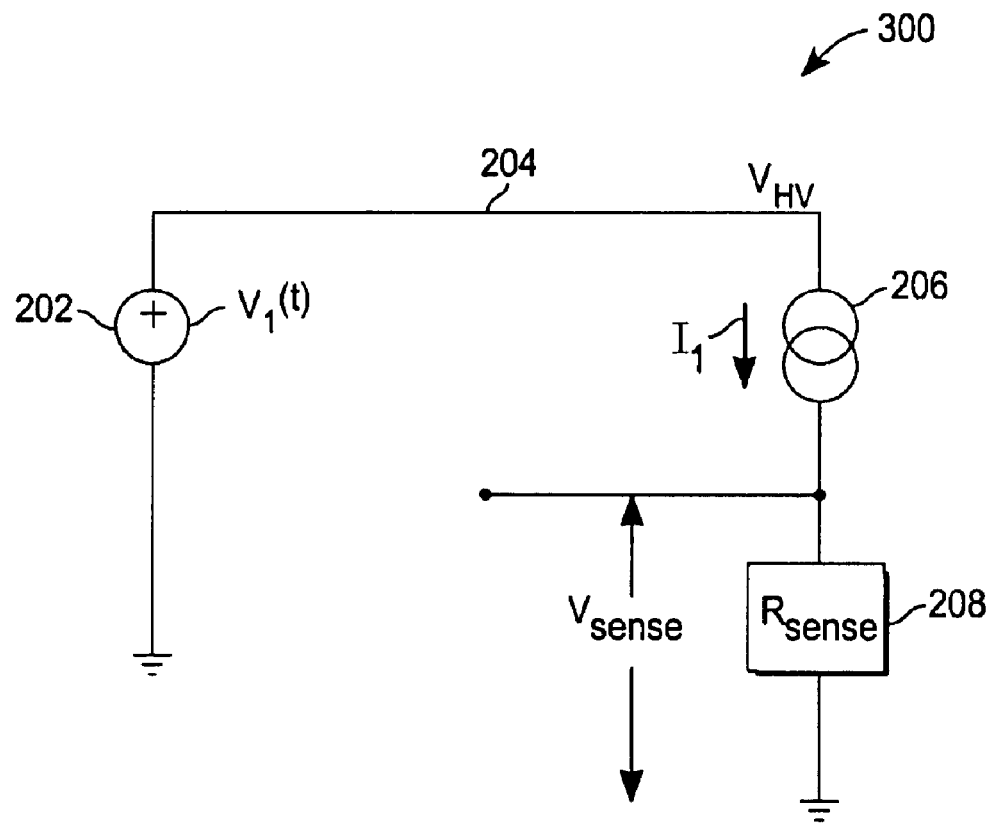
FIG. 2 illustrates a schematic diagram of another method of measuring a low voltage signal by placing the sensing resistor close to the electrical ground.

In reference to FIG. 3, a schematic diagram of a high voltage to low voltage interface integrated circuit (IC) 400 according to the present invention is illustrated. The high voltage interface IC circuit 400 comprises mainly a current mirror 420 coupled to a means for current-to-voltage conversion 460.

The master current source 422 uses a high voltage signal $V_{hv}$ to generate a reference current and create other mirrored currents. When there is no small voltage signal $V_s$, the common mode rejection (CMR) of the means for current-to-voltage conversion 460 rejects these common-mode currents and only produces a reference voltage proportional to the reference current. When there is a small current flowing through the external sensing resistor, the balance of the current mirror is disturbed. As a result, the means for current-to-voltage conversion 460 converts this unbalanced current into a voltage proportional to the small signal voltage $V_1$. The gain of the means for current-to-voltage conversion compensates for the reduction factor discussed in the sensing resistor circuit 100 above. And thus, the high-to-low voltage interface IC according to the present invention can match the impedance with the circuit under test (not shown), measure accurately the small voltage signal, and can be implemented at a low cost.

The detailed construction and operation of the high-to-low voltage interface IC is described as follows:

With reference to FIG. 3, a current mirror 420 comprises three NMOS transistors: a first NMOS transistor 422, a second NMOS transistor 424, and a third NMOS transistor 426. These three NMOS transistors are connected together to form a master current source and current mirror. The gates of three transistors are coupled together and to the drain of the first NMOS transistor 422. Therefore, the gates of transistors 422, 424, and 426 see the same voltage. The drain of the first transistor 422 is coupled to a resistor 430, the other terminal of the resistor 430 is coupled to a large voltage ($V_{hv}$) line 412 on which a small voltage signal is superimposed by a signal source 410 which is in series with a current source $I_1$. The drain of the second transistor 424 is coupled to a second resistor 432 and the other terminal of the resistor 432 forms a common mode voltage $V_{sense1}$.

Similarly, the drain of the third NMOS transistor 426 is coupled to a third resistor 434. The other end of the third resistor 434 is coupled to a first terminal of an external sensing resistor $R_{sense}$ 414 and forms a common mode voltage $V_{sense2}$. The differential voltage $V_{sense}$ is the voltage across the resistor 414. A current that flows through the resistor 430 is a reference current $I_0$. The other currents $I_2$ and $I_3$ flowing through resistors 432 and 434 respectively are the mirror of the reference current $I_0$. Resistors 430, 432 and 434 have equal resistance values, designated $R_1$, $R_2$ and $R_3$, respectively.

In a preferred embodiment, a means for current-to-voltage conversion is an operational amplifier (op-amp) 440. Other means for current-to-voltage conversion may be used instead of the op-amp 440. The non-inverting input terminal of the op-amp 440 is coupled to the drain of the second transistor 424, and the inverting input is coupled to the drain of the third NMOS transistor 426. A fourth resistor 442 is feedback resistor that connects its output terminal to the inverting input terminal of the op-amp 440. Non-inverting input terminal of the op-amp 440 is coupled to a fifth resistor 444 whose other end is coupled to a voltage reference Vref 446. The first DC terminal of the op-amp is coupled to a second voltage source $V_{dd}$ 448 which is the IC power supply. A second DC source of the op-amp 440 is connected to ground. The op-amp 440 converts the unbalanced currents caused by the small signal voltage $V_{sense}$ to a proportional voltage. Resistors 442 and 444 have resistance valves designated as $R_4$ and $R_5$, respectively.

The circuit preferably includes a plurality of electrostatic devices (ESD) to prevent currents from flowing into the transistors 422, 424, and 426. In a preferred embodiment, the ESD devices are pn junction devices, such as diodes, MOS transistors or equivalent devices. These pn junction devices are represented as diodes in the figure. First and second diodes, 482 and 484, are connected to the second voltage source $V_{dd}$, 448, and prevent current flow into the drain of the first transistor 422. The cathode terminal of the first diode 482 is connected to the second voltage $V_{dd}$, and the anode terminal is connected to the drain of the first NMOS transistor $Q_1$ and to the cathode of the second diode 484. The anode of the second diode 484 is connected to ground (GND). Similarly, third and fourth diodes, 486 and 488 are connected in series to prevent unwanted current flow from Vdd to the drain of the second NMOS transistor 424. The anode terminal of the third diode 486 is connected to the drain of the second NMOS transistor 724. Likewise, the fifth and sixth diode pair 490 and 492 prevent current flow into the drain of the third transistor 426.

With the connections specified above, first transistor 422 is a master current source that produces a reference current $I_0$. The reference current $I_0$ equals $(V_{hv}-V_{gs}^{Q1})/R_1$. The master current source 422 also causes mirror currents of the same value $I_0$ to flow in the drains of the second and third transistor 424 and 426. The resistors 430, 432, and 434 are of the same value so that when the small voltage signal $V_{sense}$ is zero, the mirror currents flowing across the resistors 432 and 434 are mirrors of the reference current $I_0$. The gates of transistors 422, 424, and 426 only see one $V_{gs}$. The differential voltage $V_{sense}$ is translated down to the same value on drain nodes of transistors 424 and 426 by a shift of their common mode voltage. When the small voltage signal $V_{sense}$ is zero, the common mode voltage is equal to $V_{hv}$. Then the two resistors shift down the common mode voltage by an amount equal to $I_0R_2$ or $I_0R_3$ as second and third transistors 424 and 426 try to match the current mirror at first transistor 422. In a preferred embodiment, the resistance value of resistors 430, 432, and 434 are 25 kΩ. $V_{dd}$ equals 3.3 volts, Vref equals 1.65 volts (=½ Vref). Op-amp resistors 442 and 444 are 250 kΩ.

Since the mirror currents flowing into the inverting and non-inverting terminals of the op-amp 440 are the same, the op-amp 440 thus rejects these common-mode currents. As a result, $V_{out}$ equals to Vref. Because $R_5/R_2$ equals $R_4/R_3$, the output of the op-amp 440 equals $R_4/R_3$ $(V^+-V^-)$=Vref wherein $V^+$ is the voltage at the non-inverting terminal and $V^-$ is the voltage at the inverting terminal of the op-amp 440.

Thus, when the small voltage signal $V_{sense}$ does not appear across $R_{sense}$, 414, the op-amp 440 rejects the mirror currents produced by the master current source 422, which is based on the high voltage $V_{hv}$. The result $V_{out}$ equals to the reference voltage Vref, independent of the high voltage $V_{hv}$ on line 412. Thus, the high voltage signal $V_{hv}$ has been eliminated.

When a small voltage signal $V_{sense}$ not equal to zero appears across the sensing resistor 414, the current mirror condition specified above no longer exists because the small signal voltage $V_1$ causes a current to flow across the third resistor 434 in addition to the reference current $I_0$. This additional current puts the op-amp, 440 in the differential mode and start to debalance the drain voltages of transistors 424 and 426. In the differential mode, the op-amp 440 reacts and forces the inverting terminal and non-inverting terminal to be equal, forcing $V_{out}$ to shift by an amount proportional to $V_{sense}$. In the differential mode, $\Delta V_{out}$ equals $\Delta I_{out}$ times $R_5$. $\Delta V_{out}=\Delta I_0 \cdot R_5=V_{sense}/R_3 \cdot R_5$. As a result, when there is a small voltage signal $V_{sense}$ dropping across the sensing resistor 414, the op-amp 440 adjusts to the unbalanced conditions by producing a voltage equal to $V_{sense}$, amplified by the closed loop gain of the op-amp 440. Thus, the high voltage component $V_{hv}$ is still eliminated and the wanted small voltage signal $V_{sense}$ is detected.

RC low pass filters (502–512), which are optionally provided, filter out high frequency components. High frequency signals can be potentially damaging to the transistors 422, 424, and 426. One terminal of a sixth resistor 502 is coupled to the high voltage line 412 and the other terminal is coupled to a first capacitor 504 and to the first resistor 430. The second terminal of the first capacitor 504 is coupled to ground. Similarly, a first terminal of a seventh resistor 506 is coupled to the first terminal of the sensing resistor 414; a second terminal is coupled to a second capacitor 508. The second terminal of the capacitor 508 is coupled to ground, forming an RC low pass filter with the seventh resistor 506. The other terminal of the sensing resistor 414 is coupled to an eighth resistor 510. A third capacitor 512 is coupled to the other terminal of the resistor 510 and to the third resistor 434. The second terminal of the capacitor 512 is coupled to ground. The low pass filters, formed by $R_6/C_1$, $R_7/C_2$, and $R_8/C_3$ pairs, filter out unwanted high frequency components that are potentially damaging to the transistors 422, 424, and 426. If the filters are left off, resistors 430, 432 and 434 typically have 25 kΩ values. If the optional filters are provided, typical resistance values for the resistors 502, 508 and 512 have capacitance values of about 10 pF. These optional low pass filters do not affect the overall basic operation of the IC as described above.

What is claimed is:

1. A high-to-low voltage interface integrated circuit (interface IC) configured to be coupled to an external sensing resistor and a signal source for producing a signal consisting essentially of a high voltage on which a small voltage signal is superimposed comprising:

a) current source means, configured to be coupled to the signal source for creating a reference current based on the high voltage and a differential current which is based in part on the small voltage signal; and b) means for current-to-voltage conversion, configured to be coupled to the current source means, for processing the reference and differential currents by eliminating the high voltage and converting a portion of the differential current caused by the small voltage signal that flows through the sensing resistor into a voltage proportional to the small voltage signal.

2. The interface IC of claim 1 wherein the current source means further comprises a first NMOS transistor, a second NMOS transistor, and a third NMOS transistor; the first NMOS transistor having a drain and a gate coupled to each other and to a first resistor, and having a source coupled to an electrical ground; the second and third NMOS transistors both having gates coupled to each other and to the gate of the first NMOS transistor, the second and the third NMOS transistors also both having sources coupled to the electrical ground; a drain of the second NMOS transistor being coupled to a second resistor and a drain of the third NMOS transistor being coupled to a third resistor.

3. The interface IC of claim 1 wherein the means for current-to-voltage conversion further comprises an operational amplifier (op-amp) with a non-inverting input terminal, an inverting input terminal and an output terminal; the non-inverting input terminal and the inverting input terminal being coupled to the current source means; the output terminal of the op-amp being coupled to the inverting input terminal through a first resistor; the non-inverting terminal being coupled to an external reference voltage source through a second resistor; a first DC terminal of the op-amp being coupled to an external voltage source for setting the upper voltage limit for the op-amp, and a second DC terminal being coupled to the electrical ground for setting a lower voltage limit for the op-amp.

4. The interface IC of claim 1 further comprising means for electrostatic discharge (ESD) protection.

5. The interface IC of claim 4 wherein the means for ESD protection comprises first and second pn junction devices coupled in series to another and to the current source means; an anode terminal of the first pi junction device being coupled to the electrical ground and a cathode terminal of the first pn junction device being coupled to the anode terminal of the second pn junction device and to the current source means; the cathode terminal of the second pn junction device being coupled to a voltage source for preventing ESD discharge therefrom into the current source means.

6. The interface IC of claim 4 wherein the means for ESD protection comprises first and second pn junction devices coupled in series to another and to the current source means; an anode terminal of the first pn junction device being coupled to the electrical ground and a cathode terminal of the first pi junction device being coupled to the anode terminal of the second pn junction device and to the current source means; the cathode terminal of the second pn junction device being coupled to a voltage source for preventing ESD discharge therefrom into the current source means.

7. A high-to-low voltage interface integrated circuit (interface IC) configured to be coupled to an external sensing resistor, and a signal source for producing a signal consisting essentially of a high voltage on which a small voltage signal is superimposed comprising:

a) current source means, configured to be coupled to the signal source for creating a reference current based on the high voltage and a differential current based in part on the small voltage signal;

b) means for current-to-voltage conversion, configured to be coupled to the current source means, for processing the reference and differential currents by eliminating the high voltage and converting a portion of the differential current caused by the small voltage signal flowing through the sensing resistor into a voltage proportional to the low voltage signal; and c) external RC low pass filters coupled to the sensing resistor and the signal source configured to filter out high frequency signals therefrom.

8. The interface IC of claim 7 wherein the means for current-to-voltage conversion further comprises an operational amplifier (op-am) with a non-inverting input terminal, an inverting input terminal and an output terminal; the non-inverting input terminal and the inverting input terminal being coupled to the current source means; the output terminal of the op-amp being coupled to the inverting input terminal through a first resistor; the non-inverting terminal being coupled to an external reference voltage source through a second resistor; a first DC terminal of the op-amp being coupled to an external voltage source for setting the upper voltage limit for the op-amp, and a second DC terminal being coupled to the electrical ground for setting a lower voltage limit for the op-amp.

9. The interface IC of claim 7 further comprising means for electrostatic discharge (ESD) protection.

10. The interface IC of claim 7 wherein the current source means further comprises a first NMOS transistor, a second NMOS transistor, and a third NMOS transistor; the first NMOS transistor having a drain and a gate coupled to each other and to a first resistor, and having a source coupled to an electrical ground; the second and third NMOS transistors both having gates coupled to each other and to the gate of the first NMOS transistor, the second and the third NMOS transistors also having sources coupled to the electrical ground; a drain of the second NMOS transistor being coupled to a second resistor and a drain of the third NMOS transistor being coupled to a third resistor.

* * * * *